US010191681B2

(12) United States Patent
Nguyen et al.

(10) Patent No.: US 10,191,681 B2
(45) Date of Patent: Jan. 29, 2019

(54) SHARED BACKUP POWER SELF-REFRESH MODE

(71) Applicant: HEWLETT PACKARD ENTERPRISE DEVELOPMENT LP, Houston, TX (US)

(72) Inventors: Hai Ngoc Nguyen, Spring, TX (US); Han Wang, Sugar Land, TX (US); Patrick A. Raymond, Houston, TX (US); Raghavan V. Venugopal, Spring, TX (US)

(73) Assignee: HEWLETT PACKARD ENTERPRISE DEVELOPMENT LP, Houston, TX (US)

( * ) Notice: Subject to any disclaimer, the term of this patent is extended or adjusted under 35 U.S.C. 154(b) by 0 days.

(21) Appl. No.: 15/324,977

(22) PCT Filed: Oct. 31, 2014

(86) PCT No.: PCT/US2014/063556
§ 371 (c)(1),
(2) Date: Jan. 9, 2017

(87) PCT Pub. No.: WO2016/069022
PCT Pub. Date: May 6, 2016

(65) Prior Publication Data
US 2017/0199692 A1 Jul. 13, 2017

(51) Int. Cl.
G11C 14/00 (2006.01)
G06F 3/06 (2006.01)
(Continued)
(52) U.S. Cl.
CPC .............. *G06F 3/0625* (2013.01); *G06F 1/30* (2013.01); *G06F 3/065* (2013.01); *G06F 3/0679* (2013.01);
(Continued)

(58) Field of Classification Search
CPC ...... G06F 3/0625; G06F 3/0679; G06F 3/065; G11C 11/005; G11C 5/141; G11C 14/00
See application file for complete search history.

(56) References Cited

U.S. PATENT DOCUMENTS 6,243,315 B1    6/2001  Goodman
6,731,563 B1 *  5/2004  Yokoyama ............. G11C 5/141
                                                365/189.09
(Continued)

FOREIGN PATENT DOCUMENTS

TW    201137586 A    11/2011
TW    201303568 A     1/2013
(Continued)

OTHER PUBLICATIONS

David Meisner, "Powernap: Eliminating Server Idle Power," Mar. 7-11, 2009, http://web.eecs.umich.edu/~twenisch/papers/asplos09.pdf.
(Continued)

*Primary Examiner* — Khamdan N. Alrobaie
(74) *Attorney, Agent, or Firm* — Brooks, Cameron & Huebsch, PLLC

(57) ABSTRACT

Example implementations relate to placing loads in a self-refresh mode using a shared backup power supply. For example, a shared backup power supply system can include a node coupled to a shared backup power supply. The node can include a plurality of loads that include volatile memory and a processing resource to place the plurality of loads in a self-refresh mode in response to a failure of a primary power supply. A shared backup power supply system can also include the shared backup power supply to provide backup power to the plurality of loads in the self-refresh mode in response to the failure of the primary power supply.

18 Claims, 4 Drawing Sheets

(51) Int. Cl.
*G06F 1/30* (2006.01)
*G11C 5/14* (2006.01)
*H02J 9/06* (2006.01)
*G11C 11/00* (2006.01)

(52) U.S. Cl.
CPC .............. *G11C 5/14* (2013.01); *G11C 5/141*
(2013.01); *G11C 11/005* (2013.01); *H02J 9/06*
(2013.01); *G11C 14/00* (2013.01)

(56) References Cited

U.S. PATENT DOCUMENTS

| | | | |
|---|---|---|---|
| 6,941,479 B1* | 9/2005 | Sugiura | G06F 1/30 |
| | | | 713/300 |
| 7,058,835 B1* | 6/2006 | Sullivan | G06F 1/30 |
| | | | 713/300 |
| 7,493,441 B2 | 2/2009 | Ashmore | |
| 7,734,953 B1 | 6/2010 | Sivertsen | |
| 2002/0065998 A1* | 5/2002 | Buckland | G06F 11/2058 |
| | | | 711/162 |
| 2007/0228832 A1 | 10/2007 | Pratt | |
| 2009/0249008 A1 | 10/2009 | Hosaka | |
| 2010/0008175 A1* | 1/2010 | Sweere | G06F 12/0866 |
| | | | 365/229 |
| 2010/0115258 A1 | 5/2010 | Jeon | |
| 2011/0239021 A1 | 9/2011 | Vedder | |
| 2012/0198136 A1 | 8/2012 | Moshayedi | |
| 2017/0040051 A1* | 2/2017 | Edirisooriya | G11C 11/40622 |

FOREIGN PATENT DOCUMENTS

| | | |
|---|---|---|
| TW | I417707 B | 12/2013 |
| WO | WO-2010006301 | 1/2010 |

OTHER PUBLICATIONS

PCT/ISA/KR, International Search Report, dated Jul. 6, 2015, PCT/US2014/063556, 13 pps.

* cited by examiner

SHARED BACKUP POWER SELF-REFRESH MODE

BACKGROUND

As reliance on computing systems continues to grow, so too does the demand for reliable power systems and backup schemes for these computing systems. Servers, for example, may provide architectures for backing up data to flash or persistent memory as well as backup power supply for powering this backup of data after the loss of power. Backup power supplies may sometimes include energy components such as capacitors or batteries. The capacitors or batteries may provide backup power to a number of memory cells that store data.

DETAILED DESCRIPTION

Figure 1:
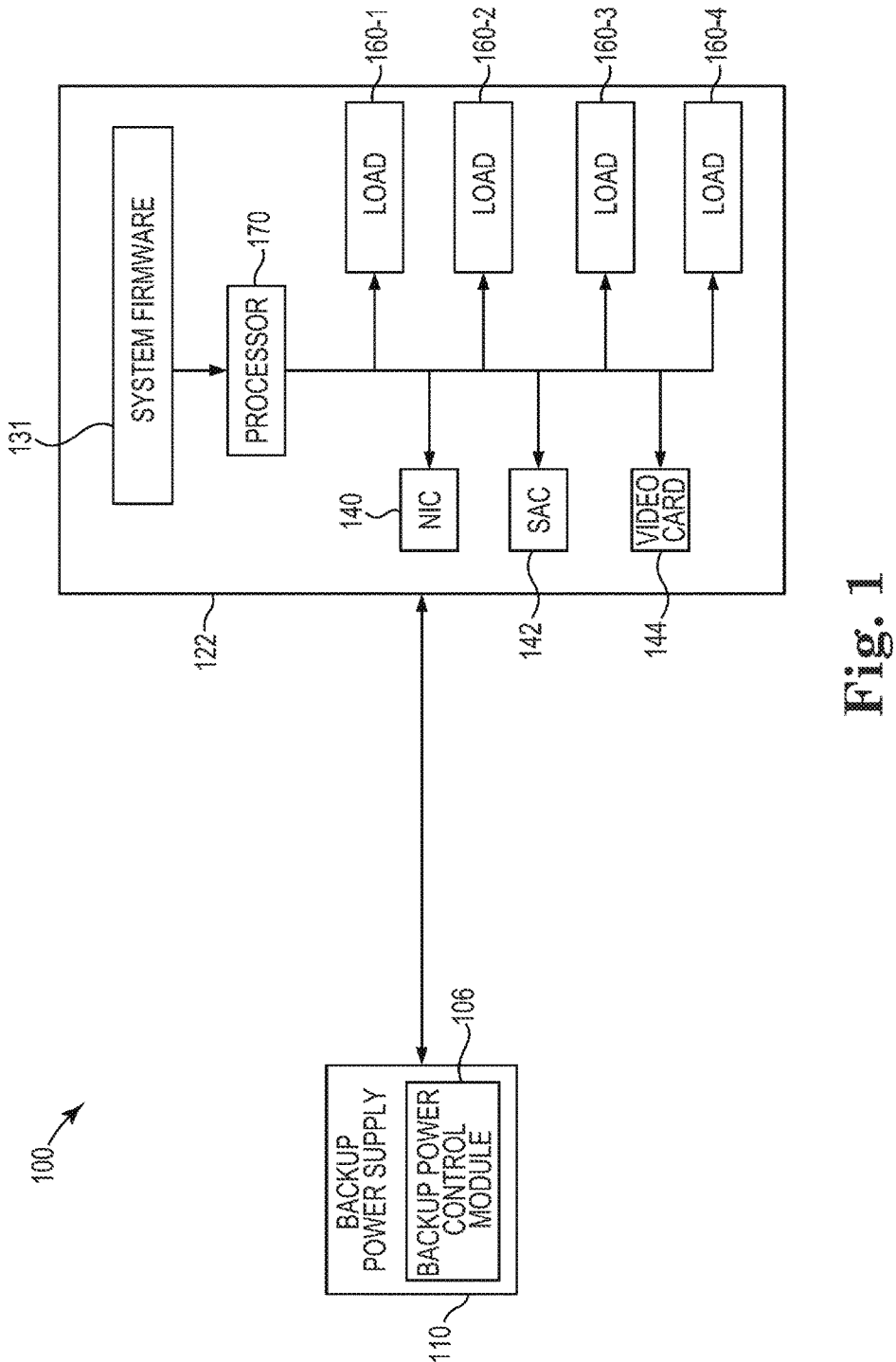
FIG. 1 illustrates a block diagram of an example of a system for shared backup power according to the present disclosure.

A computing data storage system can include a number of nodes that support a number of loads. The nodes can be a number of servers, for example. A number of loads can include storage controllers or devices associated with the servers. For example, a load can include cache memory, Dual Inline Memory Modules (DIMMs). Non-Volatile Dual In-Line Memory Modules (NVDIMMs), and/or array control logic, among other storage controllers and/or devices associated with the servers. A computing data storage system can include a parallel backup power system operatively coupled to the number of nodes to support the number of loads in an event of a removal of a primary power supply. The backup power system can place loads in a self-refresh mode to provide volatile memory the ability to behave as persistent memory.

A removal of a primary power supply can be scheduled or un-scheduled. For instance, a scheduled removal of the primary power supply can be the result of scheduled maintenance on the number of nodes and/or the number of loads. A scheduled removal of the primary power supply can be an intentional power down of the number of nodes and/or the number of loads to add and/or remove nodes to a chassis and/or network connected to a primary power supply. In another example, a scheduled removal of the primary power supply can be an intentional power down to add and/or remove one or more loads to or from one or more nodes.

An un-scheduled primary power supply removal can be a failure in the primary power supply. An un-scheduled primary power supply removal can occur when, for example, the primary power supply fails momentarily and/or for an extended period of time. Failure can include an unintentional loss of power to nodes and/or loads from the primary power supply.

It may be desirable to protect the data stored in the number of loads upon the removal of the primary power supply. Data may be protected by ensuring that the data is not lost upon the removal of the primary power supply. Data may be protected by moving data from cache memory in the number of nodes to non-volatile memory upon the removal of a primary power supply. However, moving data from cache memory to non-volatile memory can involve a power supply. A backup power supply can be a secondary power supply including backup power supply cells that are used to provide power for moving data from cache memory to non-volatile memory when the primary power is removed.

Providing backup power to protect data stored in a number of loads may include providing each node with a separate, shared backup power supply, rather than providing a backup power supply for each load within a node. That is, a single node containing a number of loads can be connected to a single shared backup power supply including a cell. However, using a cell to provide backup power to a node hosting a number of loads can have a number of disadvantages. For example, a cell can be limited in the output (e.g., backup power) it can provide and as such the node can be limited in the number loads it can host.

In accordance with examples of the present disclosure, a backup power supply can include a number of cells coupled in parallel. Providing backup power via cells coupled in parallel can increase the quantity of loads that are supported by the cells as compared to providing backup power via a single cell. Each backup power supply cell can include a charging module to charge an associated backup power supply cell. Each backup power supply cell can also include a cell controller configured to control the charging module and communicate with a management controller. A backup power system can also include the management controller configured to activate each of the plurality of backup power supply cells in parallel as each of the plurality of backup power supply cells becomes fully charged.

Providing backup power via cells coupled in parallel can also provide flexibility in adding and/or removing loads from the backup power system by adding and/or removing cells from the cells coupled in parallel without disrupting power services provided to the remaining loads.

Providing backup power to a number of nodes can include placing a portion of the number of loads in self-refresh mode. Placing loads in self-refresh mode can sustain the data stored in the number of loads upon the failure of a primary power supply. Cells coupled in parallel can provide longer backup power to the portion of the loads in self-refresh mode as compared to a single cell providing backup power to loads that are not in self-refresh mode.

Self-refresh mode can be applied to loads to move data stored in the loads. Placing loads in self-refresh mode before the data is moved can conserve energy as compared to moving data stored in the loads without placing the loads in self-refresh mode.

FIG. 1 illustrates a block diagram of an example of a shared backup power supply system 100 according to the present disclosure. As illustrated in FIG. 1, the system 100 can include a shared backup power supply 110, a backup power control module 106, and a node 122 coupled to the shared backup power supply. The shared backup power supply can be controlled by the backup power control module 106. Furthermore, the node 122 can support a plurality of loads (e.g., load 160-1, load 160-2, load 160-3, and load 160-4, collectively referred to herein as loads 160). For instance, the node 122 can support a number of storage controllers and/or a number of storage devices such as DIMMs and/or NVDIMMs. The node 122 can also support a number of devices such as a network interface controller (NIC) 140, a smart array controller (SAC) 142, a video card 144, and/or a processing resource 170.

The node 122 can include system firmware 131 that enables communication between the shared backup power supply 110 and the plurality of loads 160. System firmware can be computer executable instructions stored on the node 122. Examples of system firmware can include Basic Input/Output System (BIOS), and a Baseboard Management Controller (BMC) unit. BIOS provides initialization and testing of the hardware components of the node 122 and loads an operating system for the node when it is powered on. The BMC unit can be a specialized microcontroller embedded on the motherboard of the node 122, and that manages the interface between system management software and platform hardware. While examples herein use BIOS and a BMC unit as examples of system firmware, examples of the present disclosure are not so limited. Other types of system firmware can be used to perform the various examples described in this disclosure. Furthermore, while specific examples are outlined herein, describing actions performed by BIOS and by a BMC unit, examples are not limited. Actions described as being performed by BIOS can be performed by a BMC unit and/or other types of system firmware. Similarly, actions described as being performed by a BMC unit can be performed by BIOS and/or other types of system firmware.

The system firmware 131 can perform a number of functions related to providing shared backup power. For instance, BIOS can determine a current charge level of the shared backup power supply 110. Based on the current charge level of the shared backup power supply 110, BIOS can also determine an amount of time it will take for the shared backup power supply 110 to charge in order to provide backup power to the loads 160 and/or a subset of the loads 160.

The system firmware 131 can also determine and/or detect a failure in a primary power supply. The system firmware 131 can be coupled to the processing resource 102. The system firmware 131 can indicate to the processing resource 102 that there is a failure in the primary power supply. The processing resource 102 can place the loads 160 in a self-refresh mode. That is, the processing resource 102 can determine the occurrence of a failure in the primary power supply via the system firmware 131. As used herein, a processing resource 102 can include a central processing unit (CPU), among other types of processing resources.

A self-refresh mode provides the ability to suspend operation of a memory controller to save power without losing data stored in the loads 160. In a self-refresh mode, the data cannot be retrieved from the loads 160 and data cannot be saved into the loads 160. Placing the loads 160 in a self-refresh mode also saves power by reducing the refresh rate associated with the loads 160. In a number of examples, placing the loads 160 in a self-refresh mode can save a greater amount of energy than placing the loads 160 in a backup power mode or a mode associated with normal operation of the loads. A backup power mode is further defined in FIG. 4.

In a number of examples, the loads 160 can be placed in a self-refresh mode indefinitely if the primary power supply has not been reactivated. That is, the loads 160 can be placed in a self-refresh mode until the backup power supply fails and/or the primary power supply is reactivated. A shared backup power supply can include a number of cells coupled in parallel. Having a number of cells coupled in parallel can provide more energy to the loads 160 than a single cell could provide to the loads 160. Furthermore, placing the loads 160 in self-refresh mode can conserve energy during the moving of data to non-volatile memory.

The processing resource 102 can also place the NIC 140, SAC 142, and/or video card 144 in a self-refresh mode and/or a reset mode to preserve energy in response to a failure of the primary power supply. As used herein, a device in reset mode does not receive power until the primary power supply is again activated. A device in reset mode consumes less energy than a device in self-refresh mode, backup mode, or active mode. The NIC 140, the SAC 142, and/or the video card 144 can be placed in the reset mode if data stored in the NIC 140, the SAC 142, and/or the video card 144 is not in danger of being lost due to the failure in the primary power supply. The data is not in danger of being lost due to the primary power supply if data stored in volatile memory has been moved to non-volatile memory and/or if the data is stored in non-volatile memory. If data stored in the NIC 140, the SAC 142, and/or the video card 144 is stored in volatile memory and has not been moved to non-volatile memory, then the NIC 140, the SAC 142, and/or the video card 144 can be placed in a self-refresh mode.

The loads 160 can be memory devices that include volatile memory and/or non-volatile memory. As used herein, volatile memory includes memory that is non-persistent. Non-persistent memory is memory that does not retain stored data without energy from a primary power supply. Volatile memory can include, for example, random access memory (RAM). As used herein, non-volatile memory includes memory that is persistent. Persistent memory is memory that can retain stored data without energy from any source. Non-volatile memory can include, for example, dynamic random-access memory (DRAM) and/or static random access memory (SRAM).

The processing resource 102 can place itself in reset mode after the loads 160, the NIC 140, the SAC 142, and and/or the video card 144 are placed in self-refresh mode and/or reset mode. The processing resource 102 can place itself in reset mode to preserve energy in response to a failure in the primary power supply.

The backup power control module 106 can perform a number of functions to control the shared backup power supply 110. For example, the system firmware 131 can determine a subset of the loads 160 that are to be protected by the shared backup power supply 110. In response to determining the subset of the loads 160, the backup power control module 106 can configure the shared backup power supply to charge in order to provide backup power to the subset of the loads 160. This determination can be performed during startup (e.g., boot) of the node 122.

Figure 2:
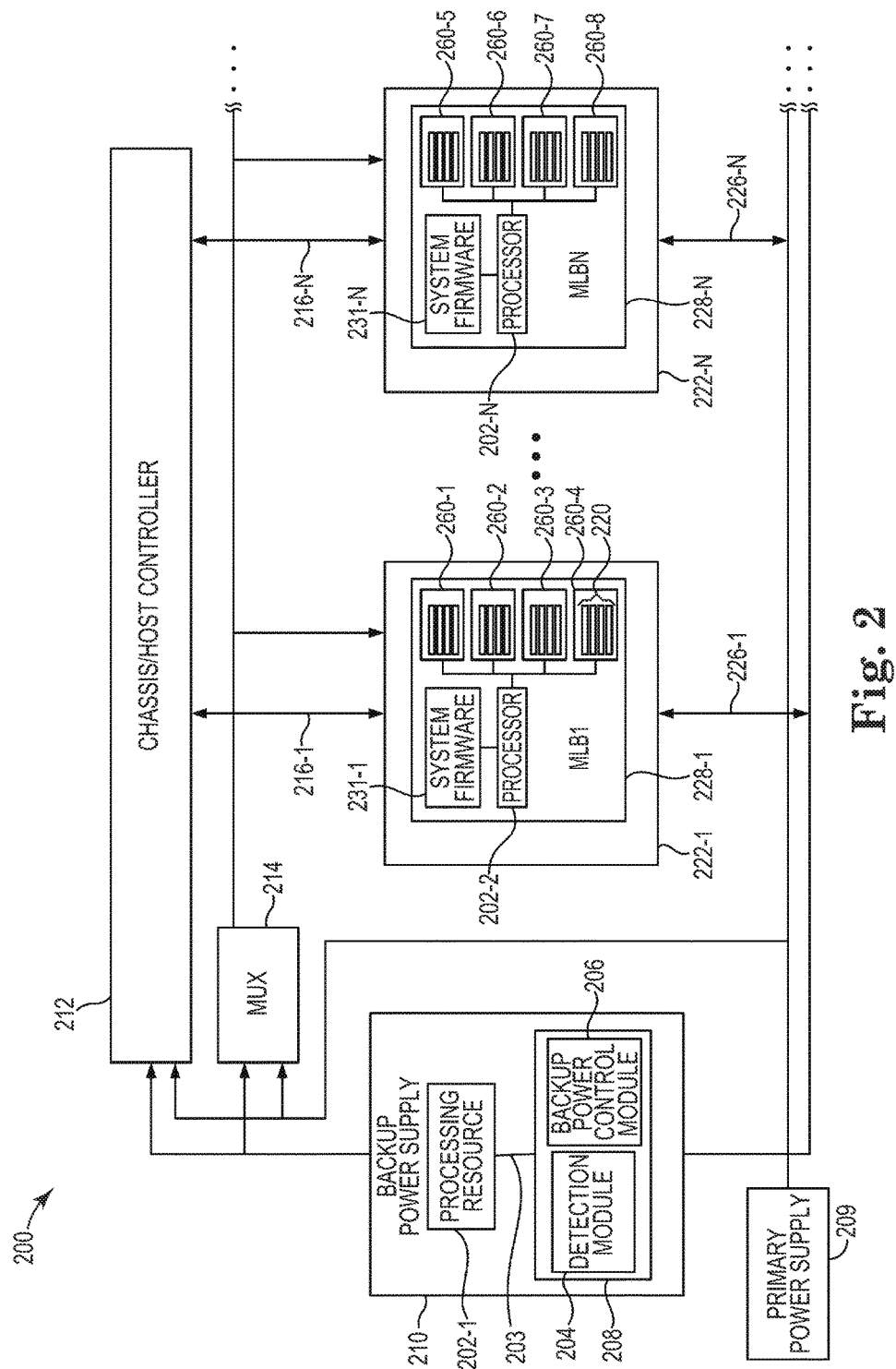
FIG. 2 illustrates a block diagram of an example of a system for shared backup power according to the present disclosure.

FIG. 2 illustrates a block diagram of an example of a system 200 for shared backup power according to the present disclosure. FIG. 2 includes the shared backup power supply 210 a multiplexer (MUX) 214, a chassis/host controller 212, and the nodes 222-1 to 222-N, collectively referred to herein as nodes 222.

As illustrated in FIG. 2, the nodes 222 can host a number of loads (e.g., loads 260-1, 260-2, 260-3, 260-4, 260-5, 260-6, 260-7, 260-8, collectively referred to herein as loads 260). The loads can include a number of devices, such as local memory or data storage (e.g., referred generally as memory). The memory may contain volatile, DIMM, and non-volatile memory (e.g., cache and NVDIMM) as described above. Thus, the nodes 222 can contain a number of memory modules 220. Each module among the number of modules 220 can provide a load to the system 200. Nodes 222 can include other devices that can provide a load to the system 200, as described above. Each of the nodes 222 can also contain a processing resource (e.g., processing resources 260-2, . . . , 260-N, collectively referred to herein as processing resources 260).

The shared backup power supply 210 can include a processing resource 202-1 connected via a connection 203 to a memory resource 208 (e.g., a computer-readable medium (CRM), machine readable medium (MRM), database, etc). In some examples, memory resource 208 and/or memory modules 220 may be a non-transitory storage medium, where the term "non-transitory" does not encompass transitory propagating signals. The memory resource 208 and/or the memory modules 220 can include a number of computing modules. The example of FIG. 2 shows an error detection module 204 and a backup power control module 206. As used herein, a computing module can include program code (e.g., computer executable instructions, hardware, firmware, and/or logic). But a computing module at least includes instructions executable by the processing resource 202-1 and/or processing resources 202 (e.g., in the form of modules, to perform particular actions, tasks, and functions described in more detail herein in reference to FIGS. 2, 3, and 4). Instructions associated with a particular module (e.g., modules 204 and 206) when executed by the processing resource 202-1 and the processing resources 202 can also be referred to and function collectively as a component and/or computing engine. As used herein, an engine can include hardware firmware, logic, and/or executable instructions. But an engine at least includes hardware (e.g., logic in the form of an application specific integrated circuit (ASIC)) to perform particular actions, tasks and functions described in more detail herein in reference to FIGS. 2, 3, and 4.

Engines and/or the number of modules (e.g., 204 and 206 shown in FIG. 2) can be sub-engines/modules of other engines/modules and/or combined to perform particular actions, tasks, and functions within a particular system and/or computing device. Engines and/or modules described herein can be located in a single system and/or computing device or reside in separate distinct locations in a distributed computing environment (e.g., cloud computing environment).

Figure 3:
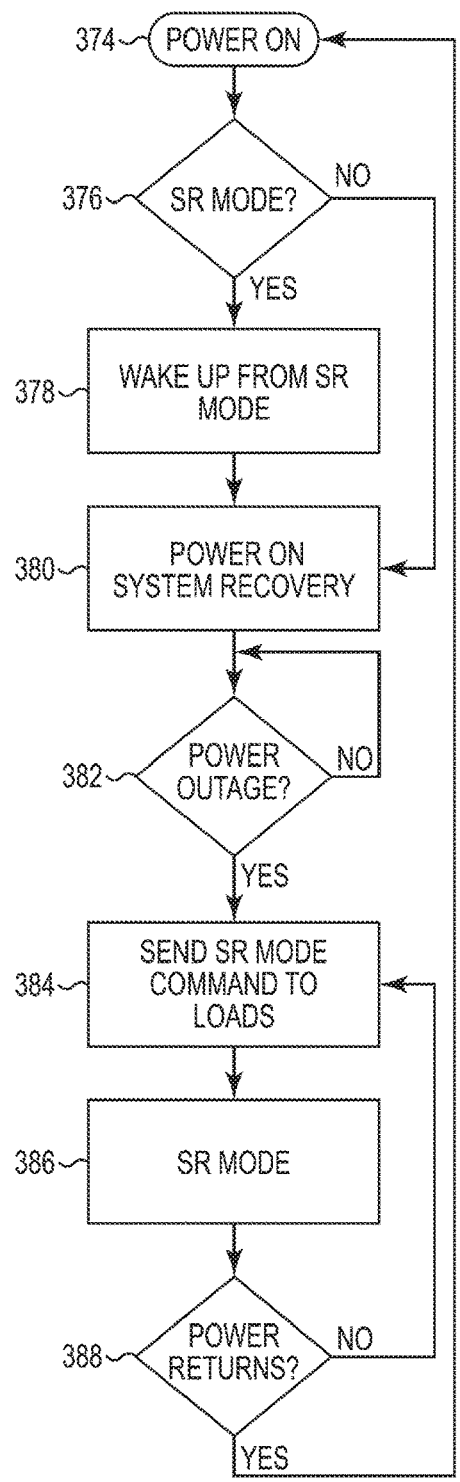
FIG. 3 illustrates a flow diagram of an example method for shared backup power supply according to the present disclosure.
Figure 4:
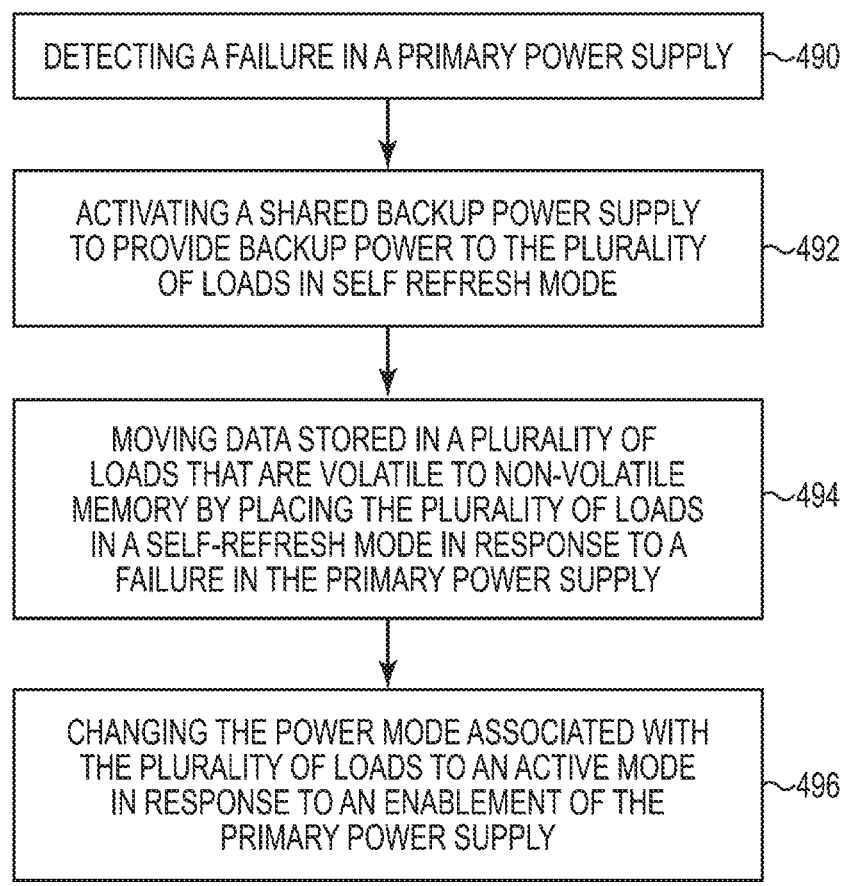
FIG. 4 illustrates a flow diagram of an example method for shared backup power supply according to the present disclosure.

The system 200 can perform a number of functions and operations as described in FIGS. 2, 3, and 4, and include the apparatus and methods for shared backup power as described herein.

The shared backup power supply 210 can be a battery that is external to the nodes 222 and external to the chassis/host controller 212 supporting the nodes 222. The shared backup power supply 210 can provide power to the nodes 222. The shared backup power supply 210 can support different chassis/host controllers (e.g., not shown) and different MUXs (not shown) to support a plurality of nodes on different chassis.

The nodes 222 can include a main logic boards (MLB) 228-1, . . . , 228-N (e.g. collectively referred to herein as MLBs 228), and the MLBs 228 can include system firmware 231-1, . . . , 231-N (e.g., collectively referred to herein as system firmware 231). The system firmware 231 can include a number of components, such as BIOS and/or a BMC unit. The MLBs 228 components can allow the nodes 222 to communicate with the shared backup power supply 210 and the chassis/host controller 212. For example, a BMC unit can communicate from BIOS to the shared backup power supply 210, a subset of the loads 260 that are to be protected by the shared backup power supply 210. In some examples, more than one subset of loads 260 can be identified for protection by the shared backup power supply 210. In another example, BIOS can determine an amount of time it will take for the shared backup power supply 210 to charge in order to provide backup power to the loads 260 or a subset of the loads 260, and can communicate the determined amount of time to the loads 260 and/or the subset of the loads 260.

Signal and control lines can connect the shared backup power supply 210 to the chassis/host controller 212 and to the MUX 214. The MUX 214 and the chassis/host controller 212 can be coupled to the nodes 222 via a signal lines 216-1, . . . , 216-N, collectively referred to herein as signal lines 216. The signal lines 216 can provide for the install, registering, data, and clocking of the nodes 222 with the chassis/host controller 212.

In some examples, the control logic (not illustrated in FIG. 2) can be coupled to the nodes via a control signal and power lines 226-1, . . . , 226-N, collectively referred to herein as control signals and power lines 226. For example, the nodes 222 can provide a signal to the control signal and power lines 226 and the signal lines 216 when the loads are to be placed in self-refresh mode and/or when the data is to be backed up to non-volatile memory. The control signal and power lines 226 and the signal lines 216 are also couple the chassis/host controller 212 to the nodes 222 and the control logic.

The system firmware 231 can allow the nodes 222 to communicate with the shared backup power supply 210. For instance, the system firmware 231 can include a BMC unit. As described herein, a BMC unit can be a specialized microcontroller embedded on the motherboard of the nodes 222, and that manages the interface between system management software and platform hardware. For example, different types of sensors built into the system 200 can report to the BMC unit on parameters such as temperature, cooling fan speeds, power status, and operating system status, among other parameters.

The shared backup power supply 210 can be connected to the nodes 222 such that the only signal that the nodes 222 receive from the backup power supply is the backup power supply's output. For example, the output from the shared backup power supply 210 to the plurality of loads 260 is only enabled when the shared backup power supply 210 has determined that it has enough charge to support the loads 260 and/or a subset of the loads 260. Until that time, the loads 260 are unaware if the shared backup power supply 210 is present in the system 200 or what state the shared backup power supply 210 is in.

The backup power control module 206 can have instructions stored in a non-transitory storage medium (e.g., memory resource 108) to communicate between the system firmware 231 and the plurality of loads 260 to determine how many loads among the plurality of loads 260 are to be protected with backup power. Further, the backup power control module 206 can communicate the number of loads 260 that are to be protected with backup power from the shared backup power supply 210 between the nodes 222 and the shared backup power supply 210 and can configure the shared backup power supply 210 in response.

In a number of examples, the backup power control module 206 can receive, from the system firmware 231 of the nodes 222, an indication of the number of nodes that are to be protected with backup power from the shared backup power supply 210. The backup power control module 206 can use the system firmware 231 to determine an amount of time that it will take to charge the shared backup power supply 210 in order to provide backup power to the plurality of loads 260 and/or a subset of the plurality of loads 260. Once this amount of time is determined, the backup power control module 206 can communicate the determined amount of time to the plurality of loads 260 and/or a subset of the plurality of loads 260. In some examples, the backup power control module 206 can also communicate information regarding a state of the shared backup power supply 210 to the plurality of loads 260 and/or a subset of the plurality of loads 260.

Further, the error detection module 204 can have instructions stored in a non-transitory storage medium (e.g., memory resource 208) to use the system firmware 231 (such as a BMC unit) to communicate error information to the plurality of loads 260 and/or a subset of the plurality of loads 260, in response to an error which causes the shared backup power supply 210 to cease providing power to the plurality of loads 260 and/or a subset of the plurality of loads 260. The error detection module 204 can communicate between the shared backup power supply 210 and the plurality of loads 260 and/or a subset of the plurality of loads 260, in an out-of-band manner from the BIOS.

In a number of examples, the processing resources 202 can detect a failure in the primary power supply 209. For example, the system firmware 231 can inform the processing resource 202 that the primary power supply 209 has failed. The processing resources 202 can place the loads 260 in a self-refresh mode. As used herein, placing the loads 260 in a self-refresh mode includes placing a number of memory modules 220 in the loads 260 in a self-refresh mode.

In self-refresh mode, the memory modules 220 draw power from the shared backup power supply 210 without requiring use of a memory controller associated with each of the nodes 222. The power drawn from the shared backup power supply 210 is only sufficient to retain data stored in memory modules 220. In self-refresh mode, the memory modules 220 draws power indefinitely until primary power is reactivated and energy from the primary power is provided to the nodes 222.

Upon the return of primary power (e.g., energy provided by the primary power supply 209), the nodes can be activated. Activating the nodes can include providing power to the processing resources 228. Activating device includes changing a power mode associated with the device to an active mode which describes an expected operation of the particular device. For example, the processing resources 228 can be placed in an active mode, the processing resources 228 can place a memory controller and the loads in an active mode.

The loads 260 can be switched from energy from the shared backup power supply 210 to energy from the primary power supply 209 in response to the enablement of the primary power supply 209. In a number of examples, the shared backup power supply 210 can be deactivated in response to the enablement of the primary power supply.

After the memory modules 220 are placed in an active state, the data stored in the memory modules 220 can be moved and/or copied to non-volatile memory. Data can be moved from volatile memory to non-volatile memory. For example, data stored in load 260-1 can be moved from volatile memory in load 260-1 to non-volatile memory in load 260-1. The data can be moved from a first portion of the plurality of loads 260 to a second portion of the plurality of loads 260. For example, data stored in load 260-1 can be moved from volatile memory in load 260-1 to non-volatile memory in load 260-1. Data can also be moved from a first node to a second node. For example, data stored in load 260-1 coupled to node 222-1 can be moved from volatile memory in load 260-1 to non-volatile memory in load 260-5 coupled to node 222-N.

In a number of examples, the data stored in the loads 260 can be moved and/or copied to non-volatile memory before the primary power supply 209 is reactivated following a failure of the primary power supply 209 as described in FIG. 4. The data can be moved and/or copied in conjunction with the use of the self-refresh mode.

FIG. 3 illustrates a flow diagram of an example method for a shared backup power supply according to the present disclosure. At 374, it can be determined whether the power is on. As used herein, determining whether the power is on includes determining whether the primary power supply is active. Determining whether the primary power supply is active can include querying the primary power supply and/or detecting energy from the primary power supply. Determining whether the power is on can also include starting up a number of nodes. Starting up a number of nodes includes providing power to nodes that previously did not have energy from a primary power supply. For example, starting up a number of nodes can include turning a node "on" after a failure in the primary power supply.

At 376, each of the nodes can determine whether any of the loads and/or the memory modules in the nodes is in a self-refresh mode. A processor and/or system firmware can detect whether the loads and/or the memory modules in the nodes are receiving energy from the backup power supply and whether the loads and/or the memory modules are being refreshed without the use of a memory controller.

At 378, the loads and/or the memory modules can be "woken up" if it is determined that at least one of the nodes and/or memory modules is in self-refresh mode. Waking up a load and/or the memory module can include placing the load and/or the memory module in an active mode. For example, a memory module can be changed from a self-refresh mode to an active mode. Changing the power mode associated with a load and/or a memory module can include first activating a memory controller such that the refresh rate is provided by the memory controller after the load and/or the memory module is activated. Waking up a load and/or memory module can also include providing power form the primary power supply instead of the backup power supply.

At 380, system recovery can be initiated. As used herein, system recovery includes storing data in volatile memory to non-volatile memory. For example, the data stored in volatile memory in a number of loads can be moved to non-volatile memory in a different number of loads. After system recovery is performed, the node can perform a number of functions within its scope of operation using energy from the primary power supply. Furthermore, the backup power supply can be recharged.

At 382, the nodes can monitor the power provided by the primary power supply to determine whether there is a power outage. A power outage can occur in response to a failure in the primary power supply. A failure in the primary power supply can be detected and reported to a processing resource in each of the nodes coupled to the primary power supply. At 382, the nodes can continue to monitor for a failure in the primary power supply until the nodes are turned off and/or until a failure in the primary power supply is detected.

At 384, a self-refresh mode command can be sent to loads in response to a failure in the primary power supply. At, 386, the loads can remain in self-refresh mode indefinitely until power from the primary power supply returns and/or until there is a failure in the backup power supply. At 388, the primary power supply can be enabled. The method can proceed to 374 in response of the primary power supply being enabled.

FIG. 4 illustrates a flow diagram of an example method for shared backup power supply according to the present disclosure. At 490, a failure in the primary power supply is detected. At 494, the shared backup power supply can be activated to provide backup power to the plurality of loads.

At 492, the data stored in the plurality of loads that are volatile can be moved to non-volatile memory by placing the plurality of loads in a self-refresh mode in response to a failure in the primary power supply. As used herein, loads are considered volatile if the loads include volatile memory modules (e.g., DIMM). After placing the loads in self-refresh mode, a processor and/or a memory controller can sequentially change the power mode associated with the loads and/or memory modules to allow data stored in the volatile memory modules to be transferred to non-volatile memory modules. Changing the power mode associated with the volatile memory modules to allow transfer of data can include changing from a self-refresh mode to a mode that consumes more energy. For example, a power mode associated with the volatile memory module can be changed from a self-refresh mode to a back-up power mode.

The backup power mode can allow a transfer of data from the volatile memory module. The backup power mode can consume more energy than the self-refresh mode because a load and/or memory module receives instructions from a memory controller and because the backup power mode can support data transfers from a volatile memory module. However, a memory module and/or a load operating in a backup power mode can use less energy than a memory module and/or a load operating in an active mode.

A power mode associated with the volatile memory module and/or a load can be sequentially changed from a self-refresh mode to a backup power mode. Sequentially changing volatile memory module and/or a load from a self-refresh mode to a backup power mode can include changing each of the volatile memory modules individually one after another. For example, a first volatile memory module can be changed to a backup power mode before other volatile memory modules are changed to a backup power mode. A second volatile memory module can be changed to a backup power mode after a first volatile memory module is changed to the backup power mode but before other volatile memory modules are changed to the backup power mode. The N−1 volatile memory module can be changed to the backup power mode after the first and the second volatile memory modules are changed to the backup power mode but before the N volatile memory module is changed to the backup power mode. The N volatile memory module can be changed to the back-up power mode after the first, second, . . . , and N−1 volatile memory modules are changed to the backup power mode.

During the operation of the volatile memory modules in back-up power mode, data stored in the volatile memory modules can be transferred to the non-volatile memory modules in response to a failure of the primary power supply. Moving and/or copying data from the volatile memory modules to the non-volatile memory modules can store that data such that the primary power failure does not affect the ability to recall the data (e.g., the data is not lost) from the associated nodes when the primary power supply is activated.

The data can be moved and/or copied round robin. Moving and/or copying data round robin can include completing the transfer of data from a first memory module before initiating a transfer of data from a second memory module.

Transferring data round robin can maintain one volatile memory module in back-up power mode and the remaining volatile memory modules in self-refresh mode. Maintaining only one volatile memory module in back-up power mode while the remaining volatile memory modules are in self-refresh mode can save energy over maintaining all of the volatile memory modules in back-up mode because volatile memory modules in self-refresh mode consume less energy than volatile memory modules in back-up mode.

Transferring data to non-volatile memory modules can include activating all of the non-volatile memory modules at once or activating each of the non-volatile memory modules at a given time. For example, each of the non-volatile memory modules can be activated round robin to receive and store the data transferred from the volatile memory modules. Activating one non-volatile memory module at a time can save energy over activating all of the memory modules at once. Activating one non-volatile memory module at a given time can occur when data transferred from the volatile memory module is only stored in one non-volatile memory module at a given time.

A volatile memory module can be placed back into self-refresh mode or reset mode after data stored in the memory module is moved and/or copied to a non-volatile memory module. Furthermore, the non-volatile memory module can be set to self-refresh mode and/or reset mode after data is transferred to the non-volatile memory. At 492, the power mode associated with the plurality of loads is changed to an active mode in response to an enablement of the primary power supply.

In the present disclosure, reference is made to the accompanying drawings that form a part hereof, and in which is shown by way of illustration how a number of examples of the disclosure may be capable of being practiced. These examples are described in sufficient detail to enable those of ordinary skill in the art to practice the examples of this disclosure, and it is to be understood that other examples may be capable of being used and that process, electrical, and/or structural changes may be capable of being made without departing from the scope of the present disclosure.

The figures herein follow a numbering convention in which the first digit corresponds to the drawing figure number and the remaining digits identify an element or component in the drawing. Elements shown in the various figures herein may be capable of being added, exchanged, and/or eliminated so as to provide a number of additional examples of the present disclosure. In addition, the proportion and the relative scale of the elements provided in the figures are intended to illustrate the examples of the present disclosure, and should not be taken in a limiting sense.

As used herein, "logic" is an alternative or additional processing resource to perform a particular action and/or function, etc., described herein, which includes hardware (e.g., various forms of transistor logic, application specific integrated circuits (ASICs), etc.) as opposed to computer executable instructions (e.g., firmware, etc.) stored in memory and executable by a processing resource. Further, as used herein, "a" or "a number of" something can refer to one or more such things. For example, "a number of widgets" can refer to one or more widgets. Also, as used herein, "a plurality of" something can refer to more than one of such things.

The above specification, examples and data provide a description of the method and applications, and use of the system and method of the present disclosure. Since many examples may be capable of being made without departing from the spirit and scope of the system and method of the present disclosure, this specification merely sets forth some of the many possible example configurations and implementations.

What is claimed is:

1. A shared backup power supply system, comprising:
a node coupled to a shared backup power supply, wherein the node includes:
  a plurality of loads that include volatile memory; and
  a processing resource to:
    place the plurality of loads in a self-refresh mode in response to a failure of a primary power supply;
    deactivate a memory controller of the node;
    refresh the plurality of loads while the memory controller is deactivated;
    sequentially place each of the plurality of loads in a backup power mode to move data stored in the plurality of loads by individually changing the plurality of loads from the self-refresh mode to the backup power mode, wherein the backup power mode supports the memory controller and data transfers; and
  the shared backup power supply to provide backup power to the plurality of loads in the self-refresh mode in response to the failure of the primary power supply.

2. The system of claim 1, wherein the plurality of loads that include volatile memory behave as persistent memory in response to being placed in the self-refresh mode.

3. The system of claim 1, the processing resource to place a smart array controller (SAC) in self-refresh mode to conserve energy in response to the failure of the primary power supply.

4. The system of claim 1, the processing resource to place a network interface controller (NIC), a video card, and a SAC in a reset mode to conserve energy in response to the failure of the primary power supply.

5. They system of claim 4, the processing resource to place itself in the reset mode to conserve energy in response to the failure of the primary power supply.

6. A non-transitory machine readable medium storing instructions executable by a processing resource to cause a computer to:
  detect a failure in a primary power supply;
  change a power mode associated with a plurality of loads coupled to the primary power supply to a self-refresh mode in response to the failure in the primary power supply;
  deactivate a memory controller;
  activate a shared backup power supply to provide backup power to the plurality of loads in the self-refresh mode;
  refresh the plurality of loads while the memory controller is deactivated;
  sequentially place each of the plurality of loads in a backup power mode to move data stored in the plurality of loads by individually changing the plurality of loads from the self-refresh mode to the backup power mode, wherein the backup power mode supports the memory controller and data transfers; and
  change the power mode associated with the plurality of loads to an active mode in response to an enablement of the primary power supply.

7. The medium of claim 6, including instructions executable to determine whether the plurality of loads are in the self-refresh mode in response to the enablement of the primary power supply.

8. The medium of claim 7, including instructions executable to move data from a portion of the plurality of loads that are volatile to a different portion of the plurality of loads that are non-volatile in response to a determination that the plurality of loads are in the self-refresh mode.

9. The medium of claim 7, including instructions executable to deactivate the shared backup power supply in response to the enablement of the primary power supply.

10. A method for providing shared backup power, comprising:
  detecting a failure in a primary power supply;
  activating a shared backup power supply to provide backup power to a plurality of loads;
  placing the plurality of loads in a self-refresh mode in response to the failure in the primary power supply, wherein the self-refresh mode does not support a memory controller and data transfers;
  activating the shared backup power supply to provide backup power to the plurality of loads in the self-refresh mode;
  sequentially placing each of the plurality of loads in a backup power mode to move data stored in the plurality of loads by individually changing the plurality of loads from the self-refresh mode to the backup power mode, wherein the backup power mode supports the memory controller and the data transfers; and
  changing a power mode associated with the plurality of loads to an active mode in response to an enablement of the primary power supply.

11. The method of claim 10, further comprising moving the data stored in the plurality of loads by placing the plurality of loads in the self-refresh mode before the data stored in the plurality of loads is moved.

12. The method of claim 10, including sequentially placing each of the plurality of loads back in the self-refresh mode based on a completion of a move of the data associated with each of the plurality of loads.

13. The method of claim 11, wherein moving data stored in the plurality of loads includes moving the data to non-volatile memory that is integrated in the plurality of loads.

14. The method of claim 11, wherein moving the data stored in the plurality of loads includes moving data to non-volatile memory that is external to the plurality of loads.

15. The method of claim 10, wherein individually changing each of the plurality of loads from the self-refresh mode to the backup power mode further comprises changing each of the plurality of loads from the backup power mode to the self-refresh mode before a different one of the plurality of loads is placed in the backup power mode.

16. The method of claim 10, wherein sequentially placing each of the plurality of loads in the backup power mode to move the data stored in the plurality of loads further comprises completing transfer of a first load data stored in a corresponding load before a second load data stored in a different one of the plurality of loads is transferred.

17. The method of claim 10, further comprising activating the memory controller before changing the power mode of the plurality of loads.

18. The method of claim 10, further comprising activating the memory controller before changing the power mode of one of the plurality of loads.

* * * * *